United States Patent [19]
Baizley et al.

[11] Patent Number: 5,907,250
[45] Date of Patent: May 25, 1999

[54] TRANSITION DETECTOR WITH TIMER

[75] Inventors: Arnold E. Baizley, Cambridge, Vt.; Gregg R. Castellucei, Plattsburgh, N.Y.; Steven J. Tanghe, Essex Junction, Vt.

[73] Assignee: International Business Machines Corporation, Armonk, N.Y.

[21] Appl. No.: 08/857,259

[22] Filed: May 16, 1997

[51] Int. Cl.[6] ............................................... H03K 5/1534
[52] U.S. Cl. ............................. 327/18; 327/24; 327/172; 327/276
[58] Field of Search ................................. 327/18, 20, 24, 327/27, 77, 78–81, 85, 87–89, 170, 172, 176, 263, 264, 266, 270, 274, 276, 278, 280, 281

[56] References Cited

U.S. PATENT DOCUMENTS

| | | | |
|---|---|---|---|
| 3,786,358 | 1/1974 | Fiorino | 327/42 |
| 3,924,068 | 12/1975 | Fletcher et al. | 178/88 |
| 4,349,754 | 9/1982 | Bull | 327/263 |
| 4,742,247 | 5/1988 | Venkatesh | 327/51 |
| 4,922,122 | 5/1990 | Dubujet | 327/64 |
| 5,036,211 | 7/1991 | Scott | 250/495.1 |
| 5,036,221 | 7/1991 | Brucculeri et al. | 326/94 |
| 5,121,356 | 6/1992 | Park et al. | 365/203 |
| 5,243,575 | 9/1993 | Sambandan et al. | 365/233.5 |
| 5,384,505 | 1/1995 | Takahashi | 327/77 |
| 5,387,882 | 2/1995 | Schoofs | 327/77 |
| 5,650,739 | 7/1997 | Hui et al. | 327/263 |

OTHER PUBLICATIONS

Cranford, et al. "Activity Detection Circuit Using FET Technology", IBM Technical Disclosure Bulletin, vol. 25 No. 12 May 1983.

*Primary Examiner*—Tuan T. Lam
*Attorney, Agent, or Firm*—Whitham, Curtis & Whitman; Eugene I. Shkurko

[57] ABSTRACT

A circuit for detecting delay of more than a set period of time from a last signal transition for any of a plurality of data signals, comprising a differential comparator, and integrator pairs for each signal, one integrator of the pair being triggered by transition of the signal from low to high and the other triggered by transition of the inverse of the signal from low to high, each integrator having a voltage measured by the differential comparator against a reference voltage, each integrator being reset by the trigger for the other integrator.

9 Claims, 4 Drawing Sheets

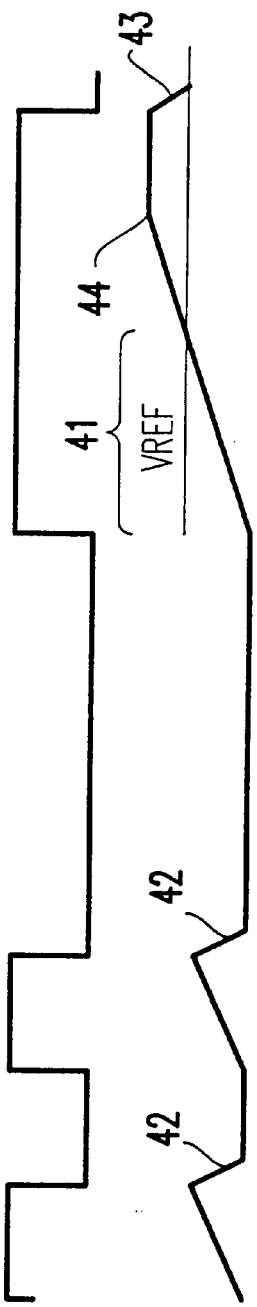
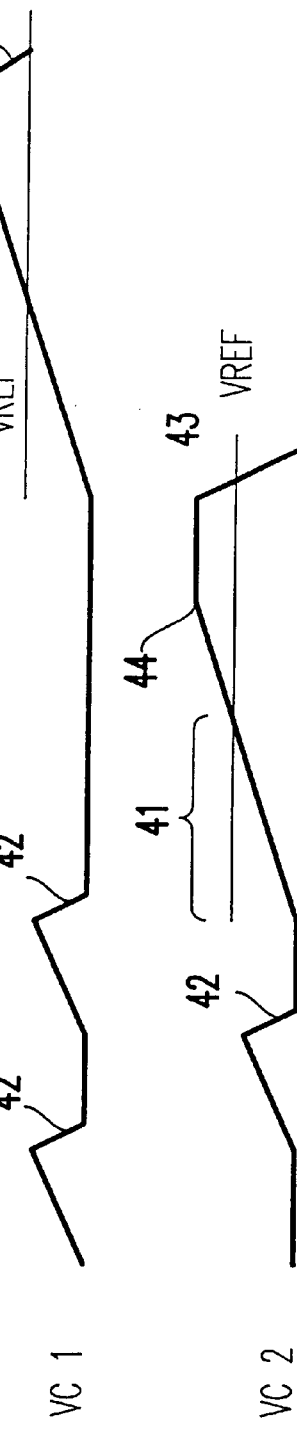
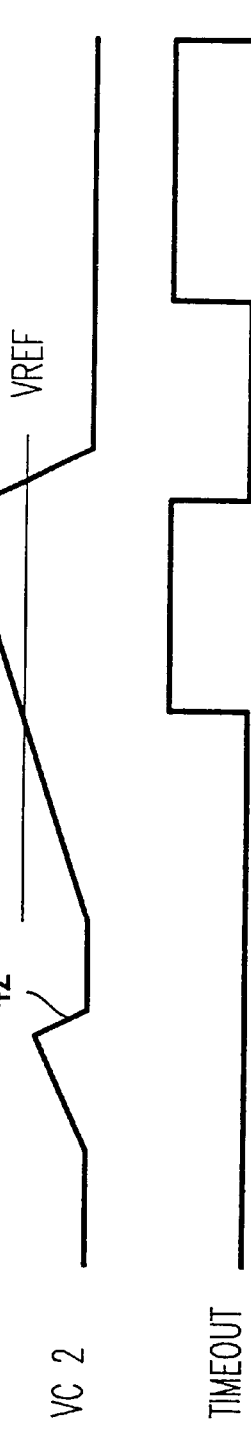
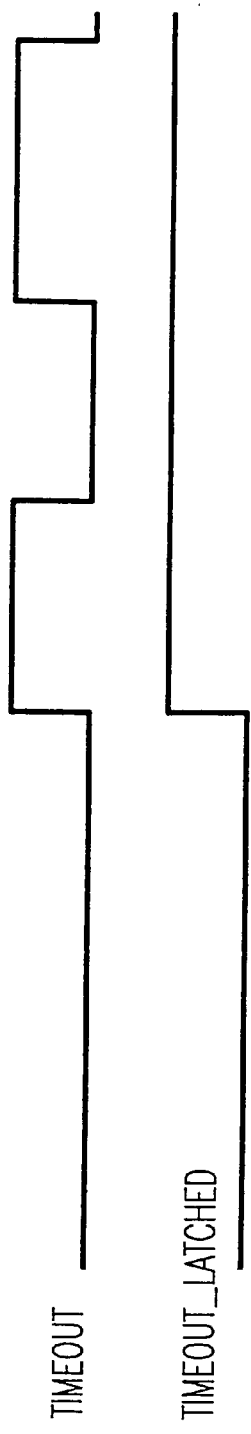
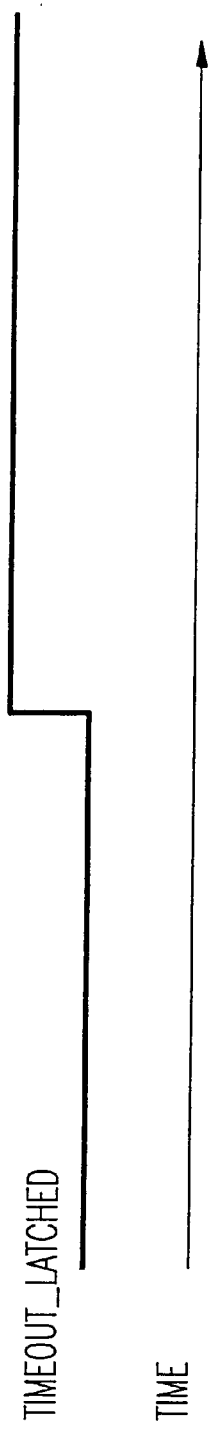

TRANSITION DETECTOR WITH TIMER

BACKGROUND OF THE INVENTION

1. Field of the Invention

The present invention generally relates to detection of signal termination, and in particular to a circuit for detecting the absence of signal transitions after a set period of time from the last transition.

2. Background Description

A variety of data communications networks and elements require circuits for detecting the presence or absence of data transmission on a signal path. Such detection is important for insuring that a particular point in a signal path is or is not functioning correctly. Improper functioning at a particular point in a signal path may be accompanied by any level of DC signal at the point. Data transmission detection is also important for insuring that a data stream is within expected tolerances of frequency or period at a particular point in a signal path.

Existing detectors (as shown in FIG. 1) typically include a capacitor 11 whose discharge delays the onset of the integration intended to trigger detection of the absence of data transmission. A flip flop 13 is used to detect transition on both positive and negative going edges. The delay after each transition is due to the exponential discharge of capacitor C based on time constant $\tau$ R*C where R is the "on" resistance of the resetting FET. As a function of time t, the voltage across the capacitor is $V_{cap}=V_T e^{-t/\tau}$. The delay for the capacitor to discharge is shown by the interval T 21 in FIG. 2, after which the circuit is reset by comparator 14. The time from the last transition required to achieve detection or timeout at comparator 15 is the sum of this delay interval 21 and the time 22 it takes to charge capacitor 11 to threshold voltage $V_T$.

This delay has long been part of prior art techniques for using transitions in a data signal to detect the presence or absence of data transmission on a signal path. This can be seen in now expired U.S. Pat. No. 3,786,358 to Florino. In the Florino patent signal transitions restart separate ramp generators for positive and negative going transitions, and comparators change state when respective ramp voltages exceed a threshold level. Comparator outputs are integrated to produce a measure of the frequency of the input data signal in relation to an expected frequency. The ramp generators cannot be set high instantaneously, and this results in a delay, as discussed at column 7, lines 40–58 in the Florino patent.

This delay serves no purpose in the logic of the detection circuit, and the consequent error can be significant when desired timeouts 23 are short. For example, to detect if a clock signal frequency drops below 100 MHZ, the corresponding period of detection would be ½* ¹⁄₁₀₀ mhz=½*10 ns=5 ns. If the capacitor 11 takes 1 ns to discharge, the prior art detection scheme would suffer a 20% error. As CPU clock speeds and signals are getting faster, timeouts are getting shorter and it is desirable to have timeout measurements which are accurate and not affected by the time T 21 required to discharge integrating capacitor 11.

Furthermore, the prior art circuitry is relatively complex. In the above referenced patent to Florino et al., for example, there are two separate one-shot circuits at the input and two comparators.

SUMMARY OF THE INVENTION

It is therefore an object of the present invention to detect when there is a delay of more than a set period of time between signal transitions.

It is a further object of the invention to provide a less complex circuit for detection of delay of more than a set period of time between signal transitions.

It is also an object of the invention to provide timeout accuracy.

It is an additional object of the invention to provide a transition detection circuit which easily can be expanded to detect delay of more than a set period of time between signal transitions for any of a plurality of input signals.

A circuit is provided for detecting signal transitions comprising a differential comparator, and paired integrators for both the signal and its inverse, each integrator of the pair being measured by the differential comparator against a reference voltage. Each integrator in the pair is discharged on the rising edge of the signal and its inverse, respectively. The circuit may be expanded to include additional input signals by duplicating the integrators and "ORing" them into the differential comparator.

The circuit according to the invention detects a delay of more than a set period of time from the last transition of each of a plurality of data signals, both for positive transitions of a signal (where the last transition was negative going) and for negative transitions of the signal (where the last transition was positive going). It is comprised of a single differential comparator, a plurality of integrator pairs, a reference voltage source and, optionally, a latch for a buffered output of the differential comparator. Each integrator pair has an integrator for one of said plurality of signals and an integrator for an inverse of said signal. The integrator accumulates voltage when the signal (or its inverse) is low, and discharges the capacitor used in the integrator when the signal (or its inverse) transitions from low to high. When one integrator is discharging, the other is detecting whether the delay from the last transition is more than a set period of time. When the next transition occurs and the roles of the two integrators are reversed, the detecting integrator has had time to discharge, in contrast to the prior art. The integrator voltages are ORed together into the differential comparator, which compares the ORed result against the reference voltage to produce a detector output which is high when the reference voltage is exceeded by the result. Optionally, the detector output may be latched.

BRIEF DESCRIPTION OF THE DRAWINGS

The foregoing and other objects, aspects and advantages will be better understood from the following detailed description of a preferred embodiment of the invention with reference to the drawings, in which:

FIGS. 4A–4F are waveforms showing operation of a transition detection circuit in accordance with the invention.

DETAILED DESCRIPTION OF A PREFERRED EMBODIMENT OF THE INVENTION

Figure 1:
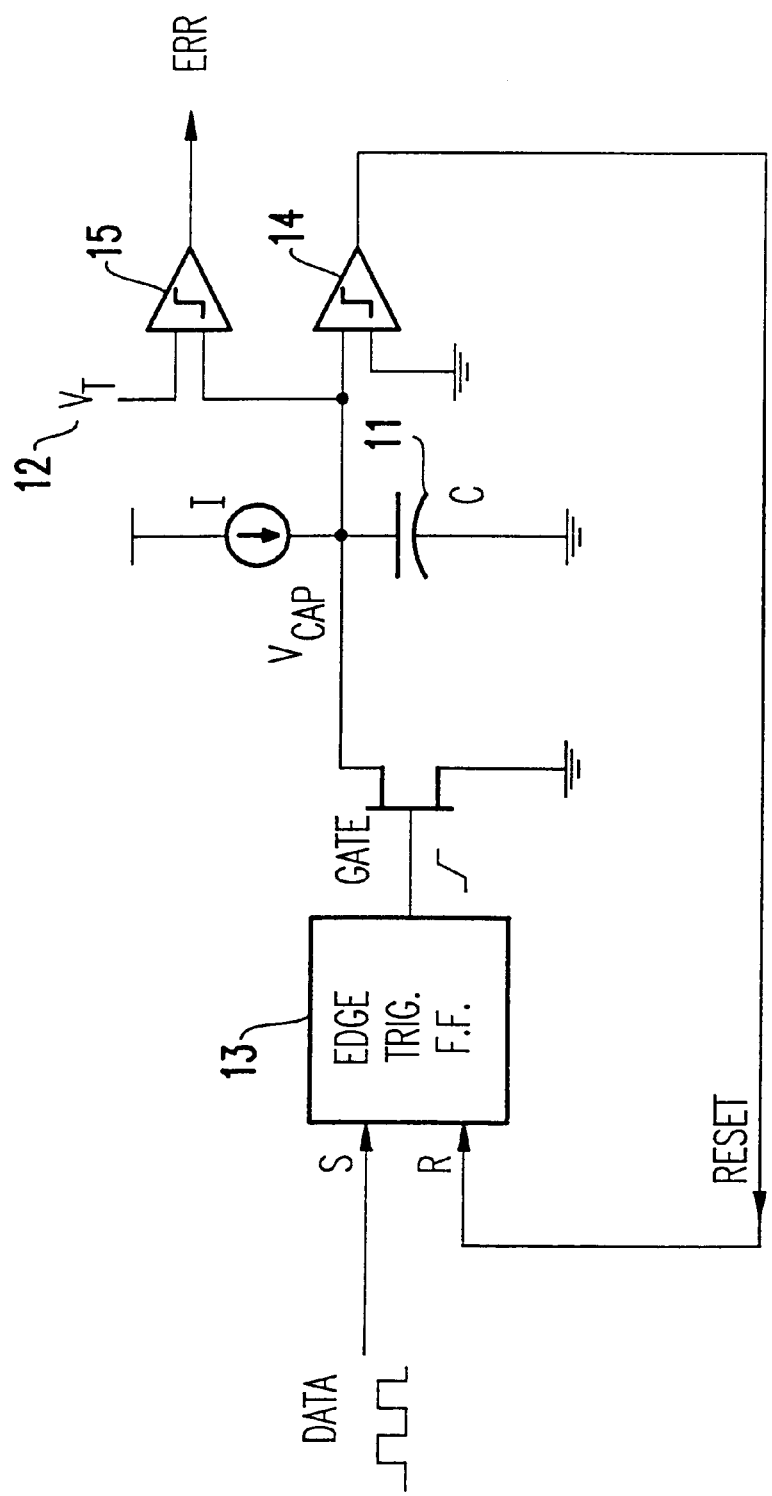
FIG. 1 is a schematic showing a prior art technique for detecting signal transitions.
Figure 2:
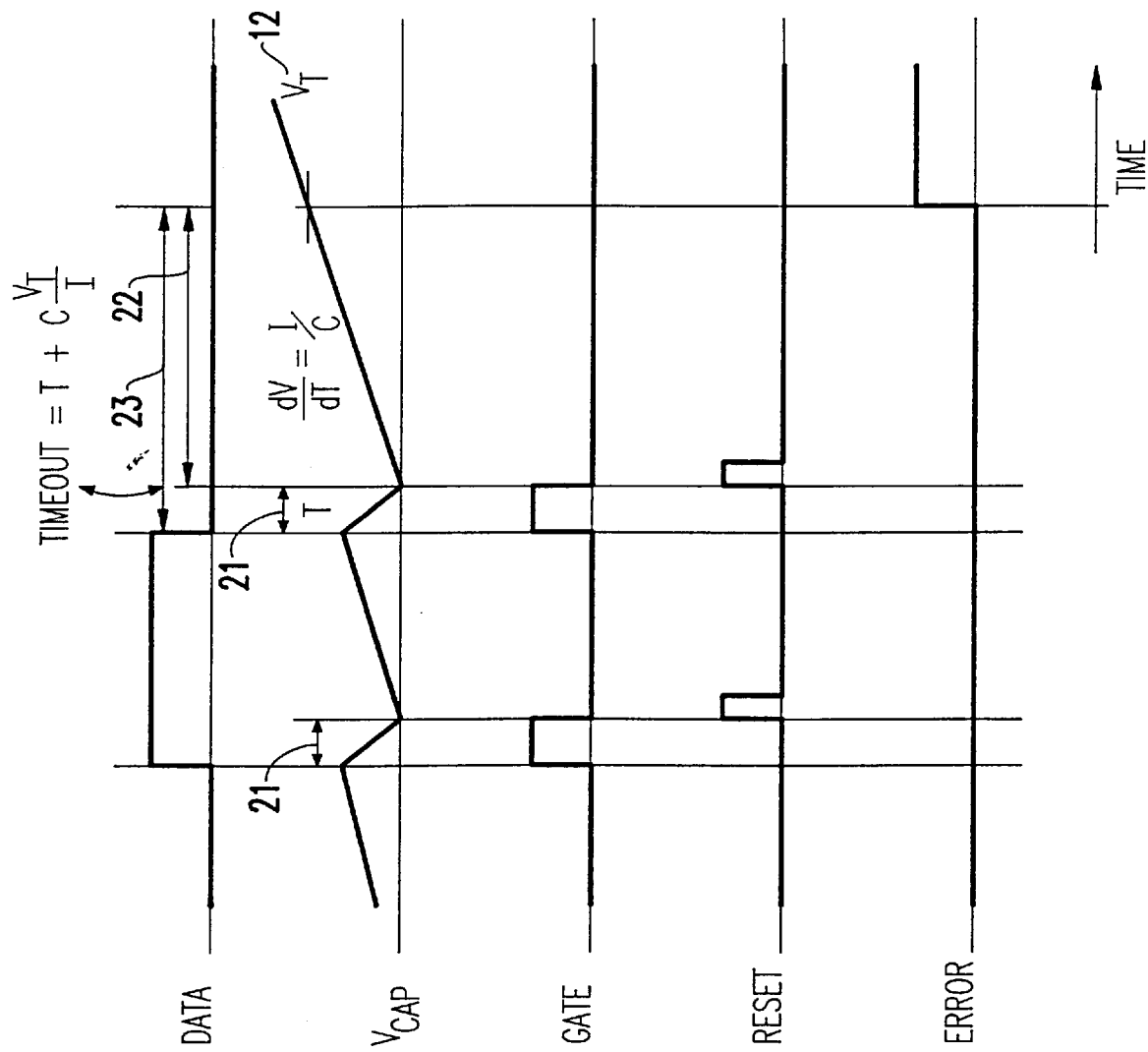
FIGS. 2A–2E are waveforms showing operation of the prior art circuitry.
Figure 3:
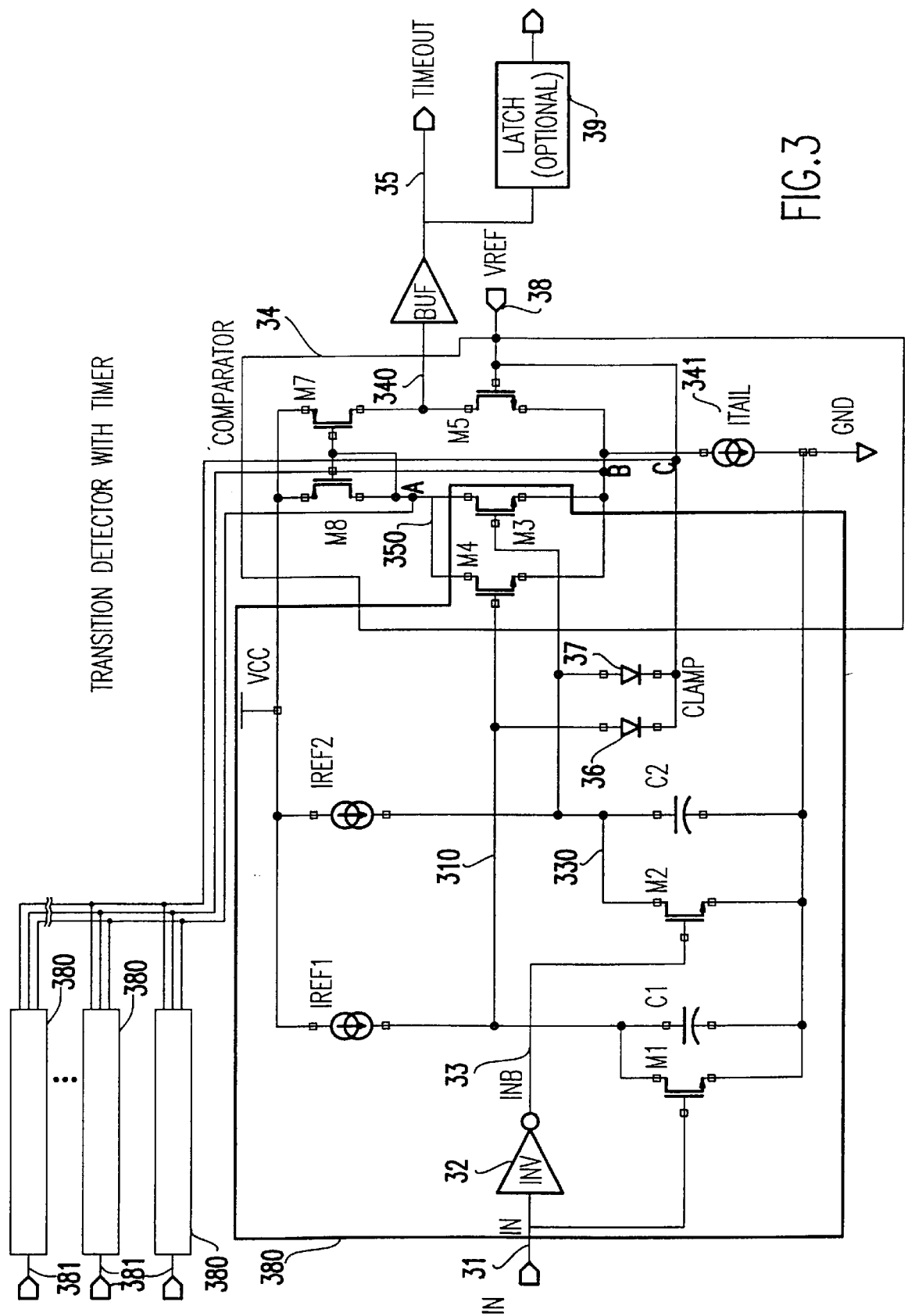
FIG. 3 is schematic of a transition detector with timer in accordance with the present invention.

Referring now to the drawings, and more particularly to FIG. 3, there is shown a transition detector with timer in accordance with the present invention. An input signal 31 transitions between the CMOS levels of 0v and VCC. Input signal 31 is inverted by inverter 32 to produce inverted signal 33 so that both polarities of the signal are available to the circuit. Examples of input signal 31 and inverted signal 33 are shown as waveforms in FIGS. 4A and 4B, respectively.

If input signal 31 is low, FET M1 will be off and precision current source IRef1 will charge capacitor C1.

Inverted signal 33 will be high, turning on FET M2 and shunting precision current source IRef2 around capacitor C2. If input signal 31 is high, FET M1 will be on and precision current source IRef1 will be shunted around capacitor C1. Inverted signal 33 will be low, turning off FET M2 and allowing precision current source IRef2 to charge capacitor C2. Since the FET's M1 and M2 are controlled by opposite polarities of the input signal 31, one of them is off while the other is on and one of the capacitors C1 and C2 is charging while the other is shunted. The voltages across capacitors C1 and C2 (at nodes 310 and 330, respectively) in response to the input signal 31 and its inverse 33 are shown as waveforms in FIGS. 4C and 4D, respectively.

If a capacitor Cx (C1 or C2 in FIG. 3) charges above the threshold voltage VRef 38 then the output of comparator 34 goes high. If the signal at nodes 310 or 330 go above VRef 38, then tail current 341 (ITAIL) gets steered up into M6 and mirrored into M7. Likewise, the current in MS will diminish. This causes output node 340 to go high. This output voltage is buffered and presented at node 35. The timeout period 41 for this sequence of events is C*VRef/IRef from the last time the input signal switched polarities. IRef is either IRef1 or IRef2 in FIG. 3, the charging current for C1 or C2, respectively, and C is C1 or C2, respectively. Circuit design values are such that C=C1=C2 and IRef=IRef1=IRef2. In chip manufacturing processes, the ratio C/IRef of capacitor and current source pairs on a given chip will be very nearly the same so that the timeout period 41 will be consistent. The optional latch 39 can be used to hold the timeout signal if the error condition goes away.

The circuit according to the present invention will not suffer from inaccuracies in timeout periods due to the time it takes the capacitor to discharge. Unlike the prior art, two capacitors are used for timing—one that charges when the input data is high and the other that charges when the input data is low. This is shown by the waveforms in FIGS. 4C and 4D. When the voltage on capacitor 2 (VC2) is rising as capacitor C2 is charging in response to the data signal (IN shown in FIG. 4A) being high. When the data signal goes low, capacitor C2 is discharged (as shown by voltage drop 42 in FIG. 4D) and held in a discharged state and capacitor C1 charges, producing the voltage VC1 shown in FIG. 4C. Similarly, when the data signal goes low, capacitor C1 is discharged (as shown by voltage drops 42 in FIG. 4C) and held in a discharged state. Thus, when a transition in the data occurs (either high to low or low to high) a fully discharged capacitor will start to charge immediately.

This is in contrast to the prior art, where in response to a data transition a single capacitor must first discharge before it starts charging, introducing timing inaccuracies as discussed above. For example, in the patent to Florino et al. discussed above, the ramp generator is reset at the beginning of the timed period. This results in a delay, as discussed at column 7, lines 40–58 in the Florino patent. By contrast, in the present invention the timers are reset at the end of the timed period, where they lie dormant until the start of the timed period and then start ramping without delay because they were already reset (i.e. discharged).

The circuit shown in FIG. 3 also includes diode clamps 36 and 37, which prevent the capacitors C1 and C2, respectively, from charging more than a diode drop above VRef 38. This clamping effect is shown by the levelling off of voltage at 44 in FIGS. 4C and 4D. This helps the shunting FETs M1 and M2 discharge the capacitors C1 and C2 quickly if and when they do turn on after a timeout has occurred, as shown by voltage drop 43 in FIGS. 4C and 4D.

This circuit can easily be expanded to include several signals. The most notable usage for this is when a differential signal is used and hence there are two inputs. For each new input 381, there would be duplicated integrator pair 380 (connected to comparator 34 at points A, B, and C) including inverter 32, the pair of current sources IRef1 and IRef2, capacitors C1 and C2 and corresponding shunting transistors M1 and M2, and clamps 36 and 37. Also, transistors M3 and M4 would be duplicated to "OR" each signal into comparator 34. The entire comparator does not have to be duplicated.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A circuit for detecting a delay of more than a set period of time between signal transitions for any of a plurality of data signals, said transitions of a signal being both positive and negative going transitions, comprising:

a differential comparator having an output at an output node;

a plurality of integrator pairs, each said pair having an integrator for one of said plurality of signals and an integrator for an inverse of said one of said signals, each said integrator accumulating an integrator voltage when said one of said signals or said inverse of said one of said signals, respectively, is low and each integrator of said integrator pair being discharged upon transition of its respective signal or inverse from low to high;

a source of a threshold reference voltage, said threshold reference voltage being compared by said differential comparator against said one or more of said integrator voltages, wherein said differential comparator output changes state when said threshold reference voltage is exceeded by said one or more of said integrator voltages.

2. The circuit of claim 1, wherein each said integrator comprises:

a capacitor connected between an output node of said integrator and a second reference voltage source;

a shunting transistor connected in parallel with said capacitor;

a precision current source connected between a supply voltage and said integrator output node;

a clamp connected between said integrator output node and said threshold reference voltage source, said clamp operating to limit accumulation of charge on said capacitor.

3. The circuit of claim 2, further comprising a latch for holding said differential comparator output, wherein said second reference voltage source is a ground of said circuit.

4. The circuit of claim 2, wherein said differential comparator comprises:

a plurality of input transistors, said input transistors being connected in parallel with a common source and a common drain, there being a voltage at said common drain, there being one input transistor for each said integrator output node, said integrator output node being connected to a gate of said corresponding input transistor;

a tail current source connected between said common source and said second reference voltage source, said second reference voltage source being a ground of said circuit;

first, second and third transistors, each having a source, a drain, and a gate, said first and second transistor sources being connected to said supply voltage, said first transistor drain being connected to said common drain, said first transistor gate and said second transistor gate being connected to said common drain, said second transistor drain being connected to said third transistor drain at said differential comparator output node, said third transistor source being connected to said common source, and said third transistor gate being connected to said threshold reference voltage source.

5. A circuit for detecting a delay of more than a set period of time from a last transition of any of a plurality of data signals, comprising:

means for integrating each of said plurality of data signals after said last transition, said integration commencing without a delay upon said last transition, each said integrating means being applied to a respective one of said plurality of data signals and producing a respective voltage;

means for receiving each said respective produced voltage so that when any said respective produced voltage exceeds a threshold reference voltage there will be generated a timeout signal.

6. The circuit of claim 5, wherein each said integrating means being applied to said respective data signal comprises:

means for inverting said data signal, thereby creating an inverted data signal in addition to said data signal;

means for applying integration to said data signal and to said inverted data signal, a first instance of said applying means being applied to said data signal and being triggered by transition of said data signal from high to low and a second instance being applied to said inverted data signal and being triggered by transition of said inverted data signal from high to low, wherein said first instance is reset by transition of said data signal from low to high and said second instance is reset by transition of said inverted data signal from low to high.

7. The circuit of claim 6, wherein said applying means comprises:

means for charging a capacitor upon said transition from high to low;

means for discharging said capacitor upon said transition from low to high.

8. The circuit of claim 7, wherein said charging means is a precision reference current source.

9. The circuit of claim 7, wherein said discharging means is an FET switched on by said transition from low to high.

* * * * *

UNITED STATES PATENT AND TRADEMARK OFFICE
CERTIFICATE OF CORRECTION

PATENT NO.: 5,907,250
DATED: May 25, 1998
INVENTORS: Baizley et al.

It is certified that error appears in the above-identified patent and that said Letters Patent is hereby corrected as shown below.

Title page, item [75], line 2, delete "Castellucei" and insert -- Castellucci --.

Signed and Sealed this

Twenty-third Day of November, 1999

Attest:

Q. TODD DICKINSON

*Attesting Officer*    *Acting Commissioner of Patents and Trademarks*